United States Patent
Tamura et al.

(10) Patent No.: US 12,135,342 B2
(45) Date of Patent: Nov. 5, 2024

(54) CURRENT DETECTION DEVICE

(71) Applicant: Alps Alpine Co., Ltd., Tokyo (JP)

(72) Inventors: Manabu Tamura, Miyagi-ken (JP); Minoru Abe, Miyagi-ken (JP)

(73) Assignee: Alps Alpine Co., Ltd., Tokyo (JP)

( * ) Notice: Subject to any disclaimer, the term of this patent is extended or adjusted under 35 U.S.C. 154(b) by 124 days.

(21) Appl. No.: 18/061,337

(22) Filed: Dec. 2, 2022

(65) Prior Publication Data

US 2023/0092098 A1    Mar. 23, 2023

Related U.S. Application Data

(63) Continuation of application No. PCT/JP2021/023376, filed on Jun. 21, 2021.

(30) Foreign Application Priority Data

Jul. 14, 2020   (JP) .................................. 2020-120611

(51) Int. Cl.
    *G01R 15/20*    (2006.01)
    *G01R 15/14*    (2006.01)
    *G01R 19/00*    (2006.01)

(52) U.S. Cl.
    CPC .......... *G01R 15/207* (2013.01); *G01R 15/148* (2013.01); *G01R 19/0092* (2013.01)

(58) Field of Classification Search
    CPC ................ G01R 15/207; G01R 15/148; G01R 19/0092; G01R 15/202; G01R 15/205;
    (Continued)

(56) References Cited

U.S. PATENT DOCUMENTS 7,538,540 B2    5/2009   Tsukamoto
11,105,831 B2   8/2021   Esaka et al.
(Continued)

FOREIGN PATENT DOCUMENTS

JP    2006112968 A  *  4/2006  ............ G01R 15/20
JP    2010-002277       1/2010
(Continued)

OTHER PUBLICATIONS

International Search Report from International Application No. PCT/JP2021/023376, dated Jun. 21, 2021.

*Primary Examiner* — Tung X Nguyen
*Assistant Examiner* — Robert P Alejnikov, Jr.
(74) *Attorney, Agent, or Firm* — Beyer Law Group LLP

(57) ABSTRACT

A current detection device includes a plurality of current detection units arranged in the current detection device. Each of the current detection units includes a bus bar that enables a current to be measured to flow therethrough, a magnetic sensor disposed at a position facing the bus bar, and a pair of shields disposed so as to sandwich the bus bar and the magnetic sensor in a facing direction in which the bus bar and the magnetic sensor face each other. The bus bars of the plurality of current detection units extend so as to be aligned to one another and, as viewed in the facing direction, the positions of the shield and the magnetic sensor of each of the current detection units in an extension direction of the bus bars differ from the positions of the shield and the magnetic sensor of the adjacent current detection unit.

2 Claims, 6 Drawing Sheets

(58) Field of Classification Search
CPC ... H04L 7/0037; H04L 25/14; H04L 25/4917; H04L 7/033; H04L 7/0276; G06F 13/4273; G06F 13/4291
USPC .......................... 324/117 R, 117 H, 126, 127
See application file for complete search history.

(56) References Cited

U.S. PATENT DOCUMENTS

| | | |
|---|---|---|
| 11,280,813 B2 | 3/2022 | Hebiguchi et al. |
| 11,287,450 B2 | 3/2022 | Tamura et al. |
| 2016/0258985 A1* | 9/2016 | Nomura ............... G01R 15/207 |
| 2021/0063446 A1* | 3/2021 | Miyamoto ........... G01R 15/205 |

FOREIGN PATENT DOCUMENTS

| | | |
|---|---|---|
| JP | 5263494 B2 * | 8/2013 |
| JP | 2017-102023 | 6/2017 |

* cited by examiner

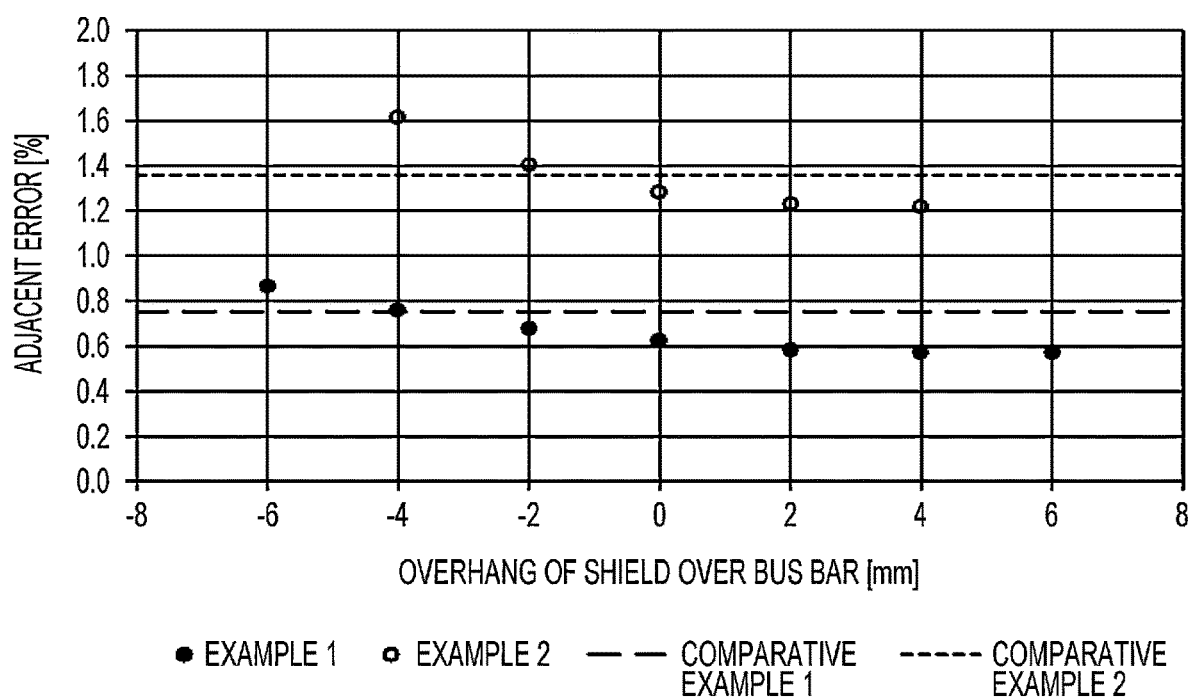

CURRENT DETECTION DEVICE

CLAIM OF PRIORITY

This application is a Continuation of International Application No. PCT/JP2021/023376 filed on Jun. 21, 2021, which claims benefit of Japanese Patent Application No. 2020-120611 filed on Jul. 14, 2020. The entire contents of each application noted above are hereby incorporated by reference.

BACKGROUND OF THE INVENTION

1. Field of the Invention

The present invention relates to a current detection device that measures a current to be measured on the basis of the magnetic field generated by the current to be measured flowing in a bus bar.

2. Description of the Related Art

A current sensor described in Japanese Unexamined Patent Application Publication No. 2017-102023 includes a conductor through which a current to be measured flows, a magnetic sensor that measures the induced magnetic field generated by the current to be measured, a case with an accommodation space that accommodates the conductor and the magnetic sensor and an accommodation space opening that leads to the accommodation space, a lid that covers the accommodation space opening, and a lid magnetic shield fixed to the lid by integral molding. The lid has a shield-exposed opening that exposes an edge portion of the lid magnetic shield. This makes it easy to visually confirm whether the lid magnetic shield is fixed at the proper position in the lid by viewing the shield-exposed opening.

SUMMARY OF THE INVENTION

However, in the current sensor described in Japanese Unexamined Patent Application Publication No. 2017-102022, when the distance between conductors is reduced in accordance with the demand of recent years for downsizing current sensors and, thus, the configuration is changed to reduce the size of the current sensor in the extension direction of the conductors, a sufficient shielding effect cannot be obtained. For this reason, it is difficult to diminish the influence of induced magnetic fields generated by the current to be measured flowing through adjacent conductors. More specifically, when the configuration in which adjacent conductors are staggered in an extension direction of the conductors is changed to the configuration in which the adjacent conductors are aligned to each other in order to reduce the size of the current sensor in the extension direction, the effect of the induced magnetic field generated by the current to be measured flowing through the adjacent conductors increases. Furthermore, if the distance between adjacent conductors is reduced in such an aligned configuration, the influence of the magnetic field generated by the current to be measured flowing through the adjacent conductor increases more, making it difficult to perform accurate current measurement.

Accordingly, the present invention provides a current detection device capable of reducing the size of the configuration as viewed in the direction in which the bus bars and magnetic sensors face each other while diminishing the influence of a magnetic field generated by the current to be measured flowing through an adjacent bus bar (current path).

According to an aspect of the present invention, a current detection device according to the present invention includes a plurality of current detection units arranged in the current detection device. Each of the current detection units includes a bus bar that enables a current to be measured to flow therethrough, a magnetic sensor disposed at a position facing the bus bar, and a pair of shields disposed so as to sandwich the bus bar and the magnetic sensor in a facing direction in which the bus bar and the magnetic sensor face each other. The bus bars of the plurality of current detection units extend so as to be aligned to one another and, as viewed in the facing direction, the positions of the shield and the magnetic sensor of each of the current detection units in an extension direction of the bus bars differ from the positions of the shield and the magnetic sensor of the adjacent current detection unit. This configuration can reduce the influence of the magnetic field generated by the current to be measured flowing in the adjacent bus bar and, as viewed in the direction in which the bus bar and the magnetic sensor face each other, the size of the configuration can be reduced.

In the current detection device according to the present invention, it is desirable that as viewed in the extension direction of the bus bars, the shields of the adjacent current detection units partially overlap in a direction in which the bus bars are aligned. This configuration can reduce the influence of the magnetic field generated by the current to be measured flowing through the adjacent bus bar. In addition, as viewed in the direction in which the bus bar and the magnetic sensor face each other, the size of the configuration in the direction in which the bus bars are aligned can be reduced.

In the current detection device according to the present invention, it is desirable that the positions of the shields of the adjacent current detection units in the facing direction be the same, and the positions of the magnetic sensors of the adjacent current detection units in the facing direction be the same. This configuration can reduce the size of the current detection device in the facing direction.

In the current detection device according to the present invention, it is desirable that as viewed in the facing direction, at least part of one of the shields in the pair extend to a position at which the part overlaps the bus bar of the adjacent current detection unit. This allows the magnetic field generated by a current to be measured flowing through the bus bar of the adjacent current detection unit to easily pass through the shield of the current detection unit. As a result, an influence error caused by the magnetic field generated by the adjacent current detection unit (the adjacent influence error) can be reduced.

In the current detection device according to the present invention, it is desirable that as viewed in the facing direction, the shield have a notch in a portion of the outer edge of the shield, and the notch be interlocked with a portion of an outer edge of the adjacent shield. This allows the adjacent shields to be arranged more efficiently as viewed in the above-described facing direction and, thus, the overall size of the current detection device can be reduced.

BRIEF DESCRIPTION OF THE DRAWINGS

FIG. 5 is a graph illustrating a change in an adjacent influence error (an adjacent error) with respect to the overhang of a shield over a bus bar in Examples 1 and 2 and Comparative Examples 1 and 2;

DESCRIPTION OF THE PREFERRED EMBODIMENTS

A current detection device according to an embodiment of the present invention is described in detail below with reference to the accompanying drawings. In each of figures, the X-Y-Z coordinates are illustrated as reference coordinates. In the following description, the Z1-Z2 direction is referred to as the up-down direction, the X1-X2 direction is referred to as the front-rear direction, and the Y1-Y2 direction is referred to as the left-right direction. The X1-X2 direction and the Y1-Y2 direction are mutually perpendicular. The X-Y plane including these directions is perpendicular to the Z1-Z2 direction. In addition, the view from the top (the Z1 side) to the bottom (the Z2 side) is also referred to as a plan view.

First Embodiment

Figure 1:
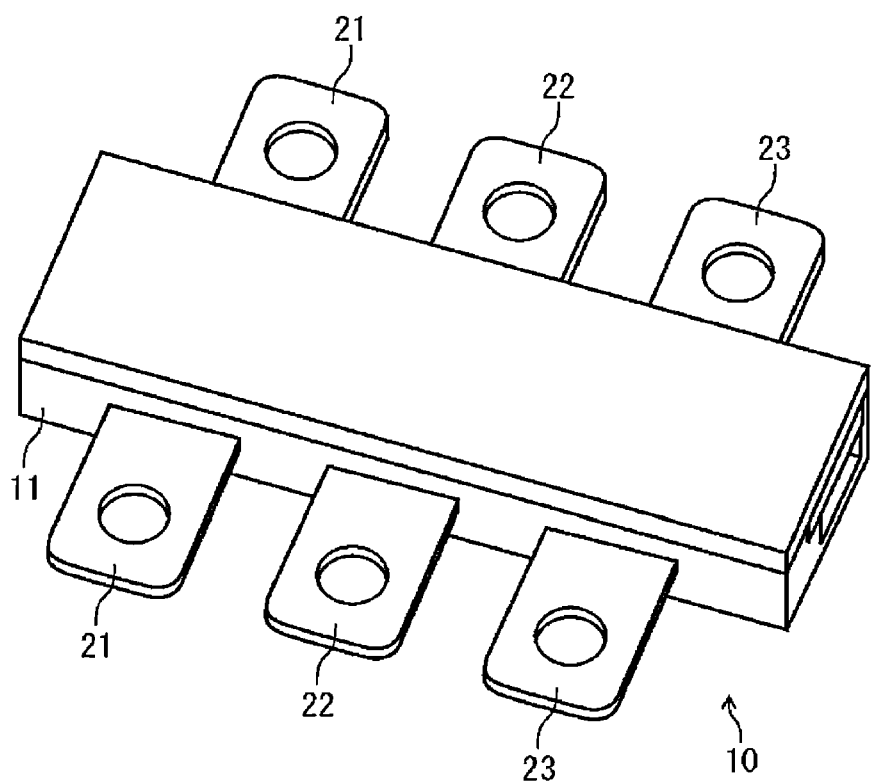
FIG. 1 is a perspective view of the configuration of a current detection device according to a first embodiment of the present invention.

As illustrated in FIG. 1, a current detection device 10 according to the first embodiment includes a case member 11 and three bus bars 21, 22, and 23 disposed so as to pass through the case member 11 in the front-rear direction (the X1-X2 direction). The bus bars 21, 22, and 23 serve as current paths. The three bus bars 21, 22, and 23 have the same elongated plate shape and are aligned to one another and extend in the front-rear direction.

Figure 2A:
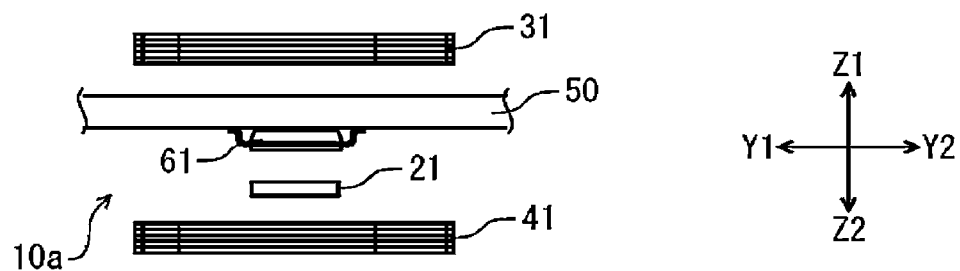
FIG. 2A is a front view of the configuration of a current detection unit including a bus bar, a magnetic sensor corresponding to the bus bar, and a pair of shields according to the first embodiment.
Figure 2B:
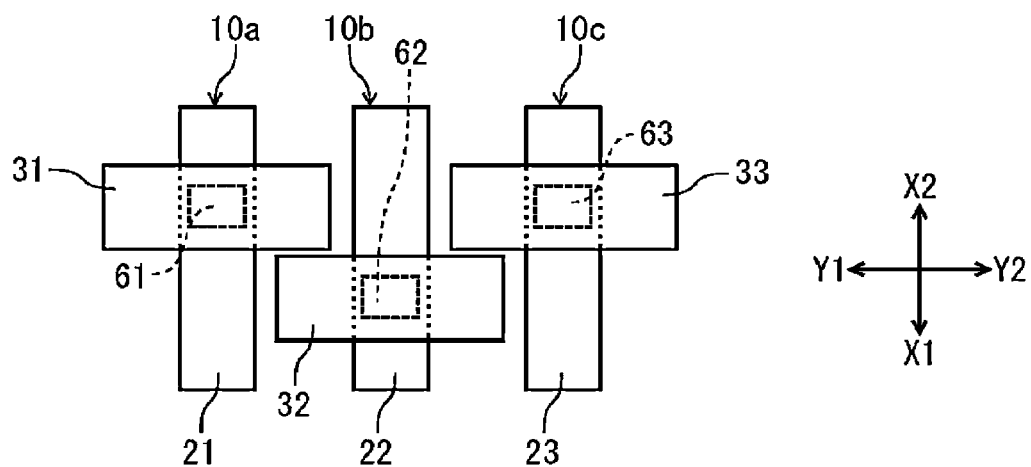
FIG. 2B is a plan view of the configuration of three current detection units including three bus bars, three magnetic sensors each corresponding to one of the bus bars, and three pairs of shields according to the first embodiment.
Figure 2C:
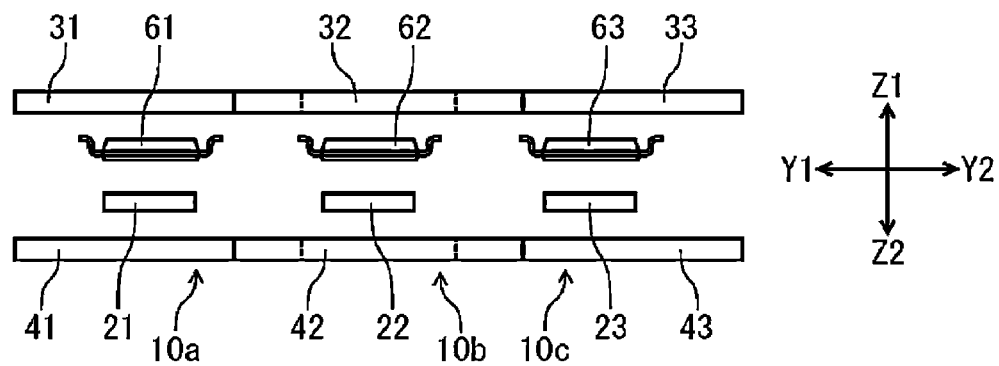
FIG. 2C is a front view of the configuration of FIG. 2B.

As illustrated in FIGS. 2B and 2C, three magnetic sensors 61, 62, and 63 are provided in the case member 11 at positions above the three bus bars 21, 22, and 23 so as to face the three bus bars 21, 22, and 23, respectively. The magnetic sensors 61, 62, and 63 can detect the magnetic fields generated by currents to be measured flowing through the bus bars 21, 22, and 23, respectively.

As illustrated in FIG. 2C, the first bus bar 21 and the first magnetic sensor 61 on the left face each other in the up-down direction (the Z1-Z2 direction) and are sandwiched from above and below by a pair of shields 31 and 41. That is, in the direction in which the first bus bar 21 and the first magnetic sensor 61 face each other, the pair of shields 31 and 41 are arranged so as to sandwich the first bus bar 21 and the first magnetic sensor 61. As a result, the first upper shield 31, the first magnetic sensor 61, the first bus bar 21, and the first lower shield 41 are arranged in order from the top to the bottom. In this manner, a first current detection unit 10a is formed in which the members lined up above and below face each other.

Like the first current detection unit 10a, a second current detection unit 10b is formed in which the second bus bar 22 and the second magnetic sensor 62 in the middle face each other and are sandwiched from above and below by another pair of shields 32 and 42, the second upper shield 32, the second magnetic sensor 62, the second bus bar 22, and the second lower shield 42 are arranged in order from the top to the bottom, and the members lined up above and below face each other.

In addition, a third current detection unit 10c is formed in which the third bus bar 23 and the third magnetic sensor 63 on the right face each other and are sandwiched from above and below by another pair of shields 33 and 43, the third upper shield 33, the third magnetic sensor 63, the third bus bar 23, and the third lower shield 43 are arranged in order from the top to the bottom, and the members lined up above and below face each other.

As illustrated by the first magnetic sensor 61 in FIG. 2A as an example, the three magnetic sensors 61, 62, and 63 are disposed on the lower surface of a substrate 50, which is accommodated in the case member 11. The three magnetic sensors 61, 62, and 63 are identical elements, and a magneto-resistive element or a Hall element, for example, is used as the magnetic sensor in accordance with the specifications or other conditions of the current detection device.

As illustrated in FIG. 2C, the three upper shields 31, 32, and 33 are disposed at the same position in the up-down direction. In addition, the three magnetic sensors 61, 62, and 63 are disposed at the same position in the up-down direction, the three bus bars 21, 22, and 23 are also disposed at the same position in the up-down direction, and the three lower shields 41, 42, and 43 are disposed at the same position in the up-down direction.

The three upper shields 31, 32, and 33 and the three lower shields 41, 42, and 43 have the same configuration. More specifically, each of the shields has a configuration in which five plate members each having a rectangular shape in plan view and made of the same magnetic material are stacked.

As illustrated in FIG. 2B, the first upper shield 31, the first magnetic sensor 61, and the first lower shield 41 below the magnetic sensor 61 on the left are disposed at the same positions in the front-rear direction as the third upper shield 33, the third magnetic sensor 63, and the third lower shield 43 below the third magnetic sensor 63 on the right, respectively. In contrast, the second upper shield 32, the second magnetic sensor 62, and the second lower shield 42 in the middle are disposed ahead of the above-described shields and sensors so as not to overlap the above-described shields and sensors. That is, when the current detection units adjacent to each other in the left-right direction are viewed in the up-down direction (the direction in which the first bus bar 21 and the first magnetic sensor 61 face each other), the shield and the magnetic sensor of one current detection unit are disposed at different positions from those of the other. In addition, the three current detection units are arranged so as to be staggered in the front-rear direction.

In addition, as illustrated in FIGS. 2B and 2C, the shields of the current detection units adjacent to each other in the left-right direction are arranged so as to partially overlap in the front-rear direction, that is, the direction in which bus bars 21, 22, and 23 are aligned (the Y1-Y2 direction). Note that the term "adjacent in the left-right direction" means a situation in which, as illustrated in FIG. 2C, the bus bars 21, 22, and 23 are arranged side by side in the left-right direction when viewed in the extension direction of the bus bars 21, 22, and 23. This term includes the case where any of the bus bars 21, 22, and 23 is shifted in the front-rear direction.

FIG. 1 and FIGS. 2A, 2B, and 2C illustrate the case of three current detection units. However, the number of current detection units can be two or four or more. Even in the case where the number of the current detection units is other than three, the current detection units are arranged side by side in the left-right direction, and the shields and magnetic sensors of the current detection units are arranged so as to be staggered in the front-rear direction (the X1-X2 direction) as viewed in the up-down direction and are partially overlap each other in the left-right direction.

According to the above-described configuration, bus bars 21, 22, and 23 can be aligned, and the distance between the current detection units can be decreased in the direction in which bus bars 21, 22, and 23 are aligned (in the Y1-Y2 direction). For this reason, the size in the front-rear direction (the X1-X2 direction) can be reduced by aligning the bus bars in the left-right direction without shifting the bus bars in the front-rear direction, and the staggered arrangement of the shields can reduce the size in the left-right direction (the Y1-Y2 direction). Furthermore, since this arrangement decreases the distance between adjacent two of the bus bars 21, 22, and 23 without reducing the size of the shield, sufficient shielding performance is ensured.

When the current detection device 10 includes three or more current detection units, it is desirable that among three current detection units lined up side by side, the two current detection units located at both ends be disposed at the same position in the front-rear direction (the bus bar extension direction), as indicated by the positional relationship between the first current detection unit 10a and the third current detection unit 10c illustrated in FIGS. 2A, 2B, and 2C. This arrangement can minimize the size of the current detection device 10 in the front-rear direction.

Modifications are described below. The above-described three upper shields 31, 32, and 33 and three lower shields 41, 42, and 43 have a structure of five flat plates of magnetic material stacked on top of one another. However, the number of layers can be set to any value other than five, or the layer can be a single layer.

Figure 3A:
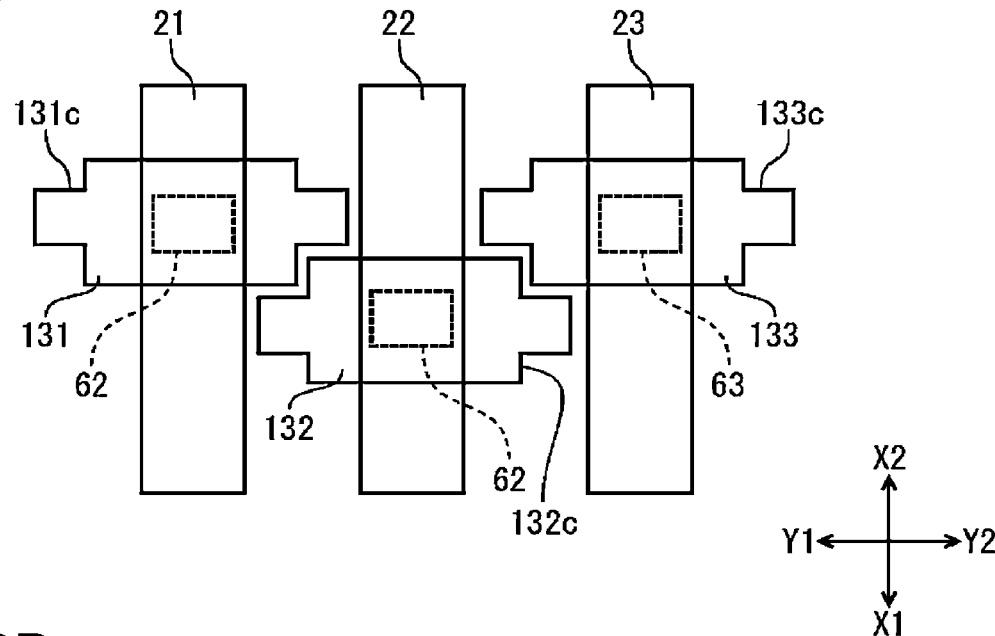
FIG. 3A is a plan view of the configuration including three bus bars, three magnetic sensors each corresponding to one of the bus bars, and three pairs of shields according to modification 1.
Figure 3B:
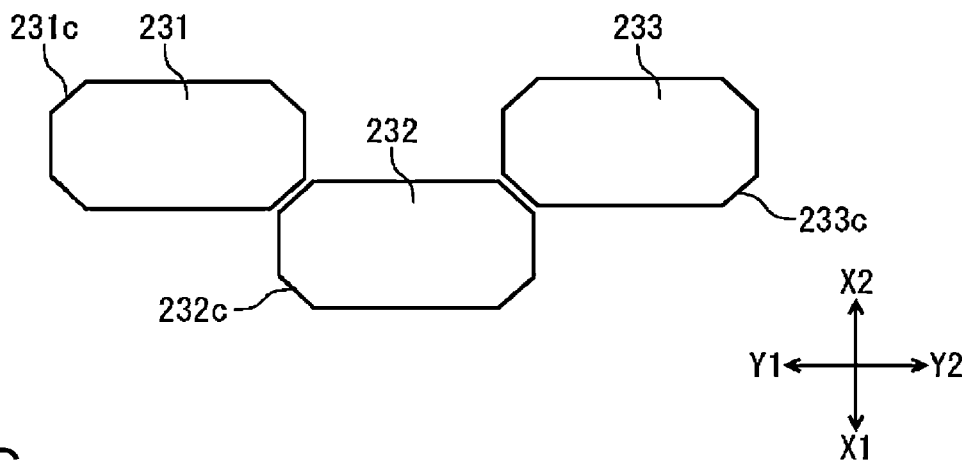
FIG. 3B is a plan view of the configuration including three shields according to modification 2.
Figure 3C:
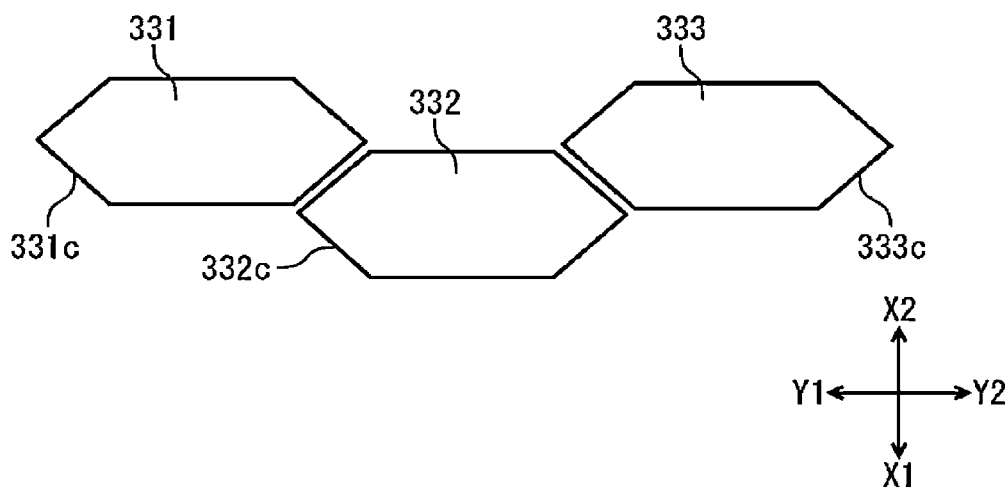
FIG. 3C is a plan view of the configuration including three shields according to modification 3.

According to the above embodiment, the planar shape of each of the three upper shields 31, 32, and 33 and three lower shields 41, 42, and 43 is rectangular. However, as illustrated in FIGS. 3A, 3B, and 3C, the planar shape can be a rectangular shape having an inward notch at each of the four corners. Such a shape enables an arrangement in which in plan view, the notches of adjacent shields are engaged with each other. Thus, the three upper shields 31, 32, and 33 and three lower shields 41, 42, and 43 may be arranged in a staggered manner within a smaller range in the extension direction of the bus bars 21, 22, and 23 (the X1-X2 direction) and, therefore, the overall size can be reduced. In addition, by arranging the shields so that the notches are engaged with each other, the distance between the current detection units in the left-right direction (the Y1-Y2 direction) can be reduced without the shield not hanging over the bus bar of the adjacent current detection unit.

Examples of the notch are illustrated in FIGS. 3A, 3B, and 3C. According to modification 1 illustrated in FIG. 3A, four corners of each of three upper shields 131, 132, and 133 are notched in a rectangular shape, so that the upper shields 131, 132, and 133 have notches 131c, notches 132c, and notches 133c, respectively. By arranging the current detection units so that vertical sides (the sides extending in the front-rear direction) of the notches of adjacent current detection units face each other in the left-right direction, the three current detection units can be compactly arranged in the left-right and front-rear directions.

According to modification 2 illustrated in FIG. 3B, four corners of each of three upper shields 231, 232, and 233 are notched in a triangular shape, so that the upper shields 231, 232, and 233 have notches 231c, 232c, and 233c, respectively. By arranging the current detection units so that hypotenuses of the notches of adjacent current detection units face each other, the three current detection units can be compactly arranged in the left-right and front-rear directions.

According to modification 3 illustrated in FIG. 3C, four corners of each of three upper shields 331, 332, and 333 are notched in a triangular shape that is larger than that of modification 2, so that the upper shields 331, 332, and 333 have notches 331c, 332c, and 333c, respectively. By arranging the current detection units so that hypotenuses of the notches of adjacent current detection units face each other, the three current detection units can be more compactly arranged in the left-right and front-rear directions than the three current detection units of modification 2.

Second Embodiment

Unlike the first embodiment, according to the second embodiment, a portion of the shield, that is, an end portion in the left-right direction is extended to a position where the end portion overlaps the bus bar of the adjacent current detection unit. The other configuration is similar to that of the first embodiment, and members similar to those of the first embodiment are identified by the same reference numerals, and detailed descriptions of the members are omitted.

Figure 4A:
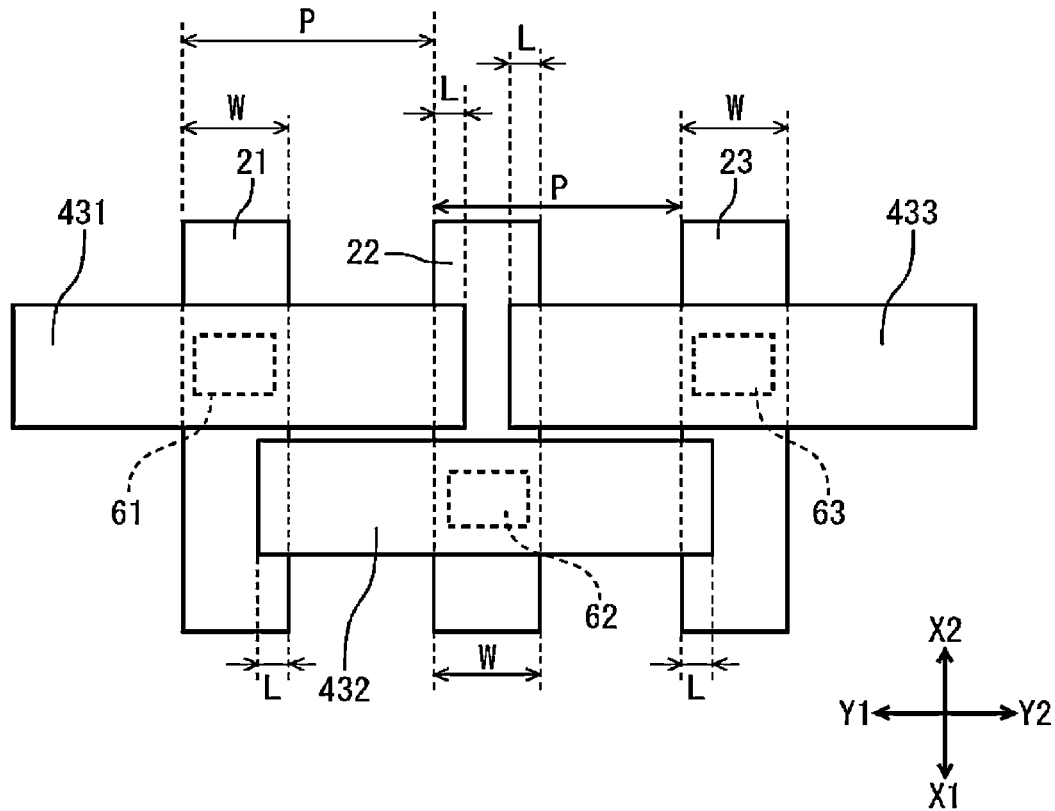
FIG. 4A is a plan view of the configuration including three bus bars, three magnetic sensors each corresponding to one of the bus bars, and three pairs of shields according to a second embodiment.

As illustrated in FIG. 4A, according to the second embodiment, three upper shields 431, 432, and 433 having the same configuration are provided. Although not illustrated, like the first embodiment, under the upper shields 431, 432, and 433, three lower shields are provided that have the same configuration as the upper shields 431, 432, and 433 and face the upper shields 431, 432, and 433 via the three magnetic sensors 61, 62, and 63 and three bus bars 21, 22, and 23, respectively.

Like the first embodiment, the first upper shield 431 on the left and the third upper shield 433 on the right are disposed at the same position in the front-rear direction. In contract, the second upper shield 432 in the middle is disposed ahead of these shields and does not overlap these shields.

In addition, in the left-right direction, the right end portion of the first upper shield 431 is extended to the position where the right end portion overlaps the second bus bar 22 in the middle. The left end portion of the second upper shield 432 is extended to the position where the left end portion overlaps the first bus bar 21 on the left, and the right end portion of the second upper shield 432 is extended to the position where the right end portion overlaps the third bus bar 23 on the right. Furthermore, the left end portion of the third upper shield 433 is extended to the position where the left end portion overlaps the second bus bar 22 in the middle.

The end portion of each of the upper shields 431, 432, and 433 in the left-right direction overlaps the adjacent bus bar by the same width L (the width in the left-right direction, the overhang). By extending the end portion of the shield in the left-right direction to a position where the end portion overlaps the bus bar of the adjacent current detection unit in this manner, the magnetic field generated by the current to be measured flowing through the bus bar of the adjacent current detection unit can easily pass through the shield of the current detection unit. For this reason, the influence error (the adjacent influence error) caused by the magnetic field generated by the adjacent current detection unit can be minimized.

FIG. 5 is a graph illustrating the result of simulation of a change in the adjacent influence error (unit: %) with respect to the overhang of a shield over a bus bar (unit: mm) (an overlap width L in the left-right direction) in Examples 1 and 2 of the second embodiment and Comparative Examples 1 and 2. As used herein, the term "adjacent influence error" refers to the ratio based on the value obtained by dividing the difference in measured value of the magnetic field between when the current to be measured is passed through and is not passed through an adjacent bus bar by the measured value when the current to be measured is not passed through the adjacent bus bar.

In Examples 1 and 2, the following values are set in the configuration illustrated in FIG. 4A:

(1) Overlap width L of the end portion of shield with the bus bar (overhang)

Example 1: −6 mm to 6 mm; Example 2: −4 mm to 4 mm

It should be noted that when the overlap width L is zero or negative, the shield and the bus bar do not overlap, and when the overlap width L is zero, the positions of the end faces of the shield and bus bar are the same in the left-right direction and, when the overlap width L is negative, the end faces are separated from each other by the value.

(2) Width W of the bus bars 21, 22, and 23

10 mm in Examples 1 and 2

(3) Distance P between adjacent two of bus bars 21, 22, and 23 (pitch)

Example 1: 16 mm; Example 2: 14 mm.

Figure 4B:
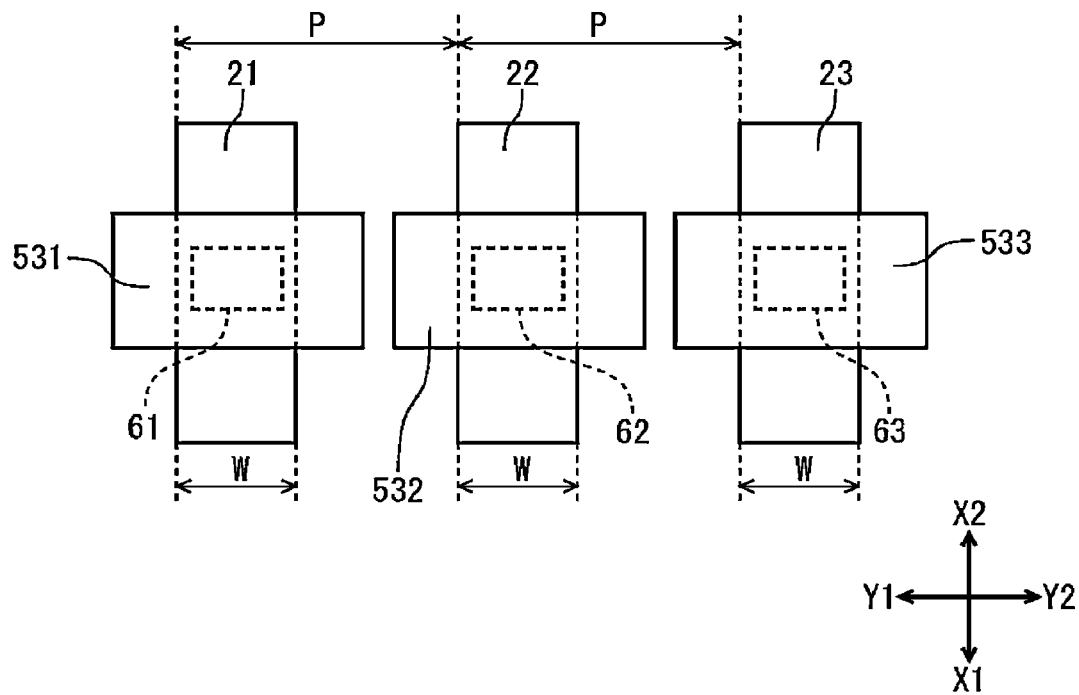
FIG. 4B is a plan view of the configuration including three bus bars, three magnetic sensors each corresponding to one of the bus bars, and three pairs of shields according to Comparative examples 1 and 2.

Comparative Examples 1 and 2 have the configuration illustrated in FIG. 4B. More specifically, like the second embodiment, three bus bars 21, 22, and 23 are aligned in the left-right direction. Three magnetic sensors (not illustrated) are disposed for the bus bars 21, 22, and 23 in the up-down direction in a one-to-one manner. In addition, three upper shields 531, 532, and 533 and three lower shields (not illustrated) are disposed so as to sandwich, from above and below, the three bus bars and three magnetic sensors that face each other, respectively. In this way, three current detection units are arranged so as to be aligned in the left-right direction. Here, the three upper shields 531, 532, and 533 and the lower shields (not illustrated) each facing one of the upper shields 531, 532, and 533 are disposed at the same position in the front-rear direction so as to extend in the left-right direction, and each of the left and right end portions of each of the shields is separated from an end portion of the adjacent shield.

In Comparative Examples 1 and 2, the following values are set in the configuration illustrated in FIG. 4B:

(1) Distance between an end portion of the shield and a bus bar (in the left-right direction):

This distance is the distance between an end portion of a shield and the end portion of a bus bar facing the shield in the up-down direction. For example, the distance is the distance between the left end portion of the bus bar 21 and the left end portion of the shield 531.

Comparative Example 1: 2 mm; Comparative Example 2: 1 mm (2) Width W of the bus bars 21, 22, and 23:

10 mm in both Comparative Examples 1 and 2

(3) Distance P between adjacent two of bus bars 21, 22, and 23 (pitch)

Comparative Example 1: 16 mm; Comparative Example 2: 14 mm.

Therefore, the distances P between adjacent two of the bus bars in Comparative Example 1 and Example 1 are the same. In addition, the distances P in Comparative Example 2 and Example 2 are the same.

In FIG. 5, as can be seen from comparison of Comparative example 1 and Example 1 in which the distances P between adjacent bus bars are the same, the adjacent influence error in Comparative Example 1 is about 0.75%, whereas the adjacent influence error in Example 1 decreases with increasing overhang greater than −4 mm. When the overhang reaches 2 mm or greater, the adjacent influence error reaches as low as 0.6% or lower. This result indicates that the adjacent influence error can be decreased by setting the overhang.

In addition, as can be seen from comparison of Comparative Example 2 and Example 2, the adjacent influence error in Comparative Example 2 is about 1.35%, whereas the adjacent influence error in Example 2 decreases with increasing overhang greater than about −1.5 mm. When the overhang reaches 2 mm or greater, the adjacent influence error reaches as low as 1.23% or lower. This result indicates that the adjacent influence error can be decreased by setting the overhang. Furthermore, the results of Example 1 and Example 2 indicate that for bus bars having a variety of widths, the adjacent influence error can be controlled by using the overhang that is set in accordance with the width of the bus bar. Other operations, effects, and modifications are the same as in the first embodiment.

Third Embodiment

Figure 6A:
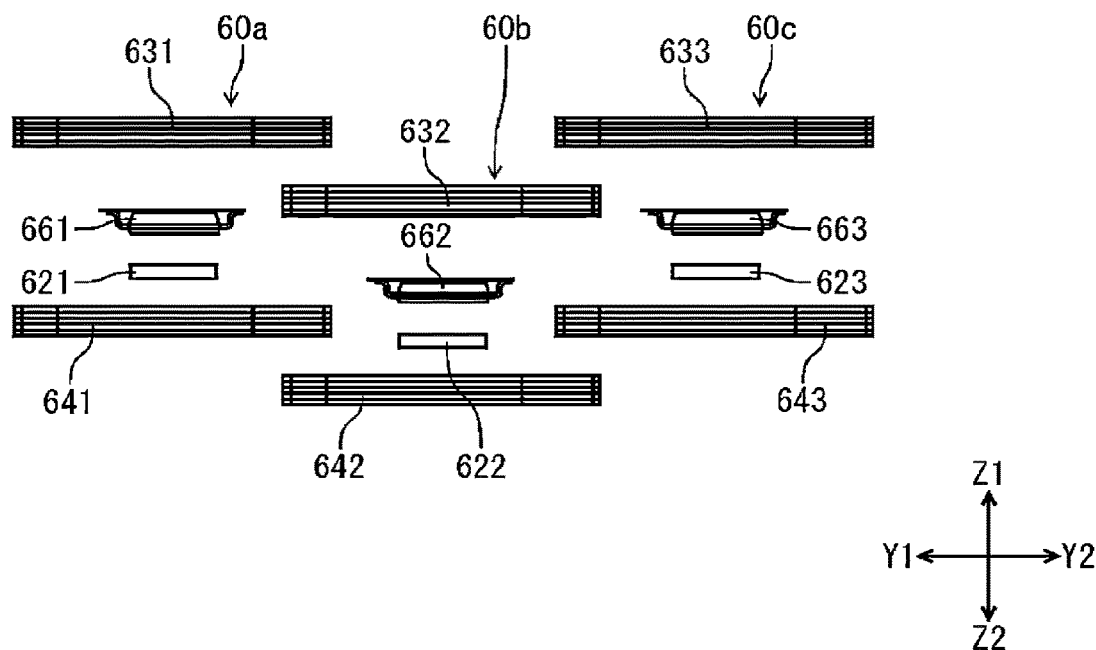
FIG. 6A is a front view of the configuration including three bus bars, three magnetic sensors each corresponding to one of the bus bars, and three pairs of shields according to a third embodiment.
Figure 6B:
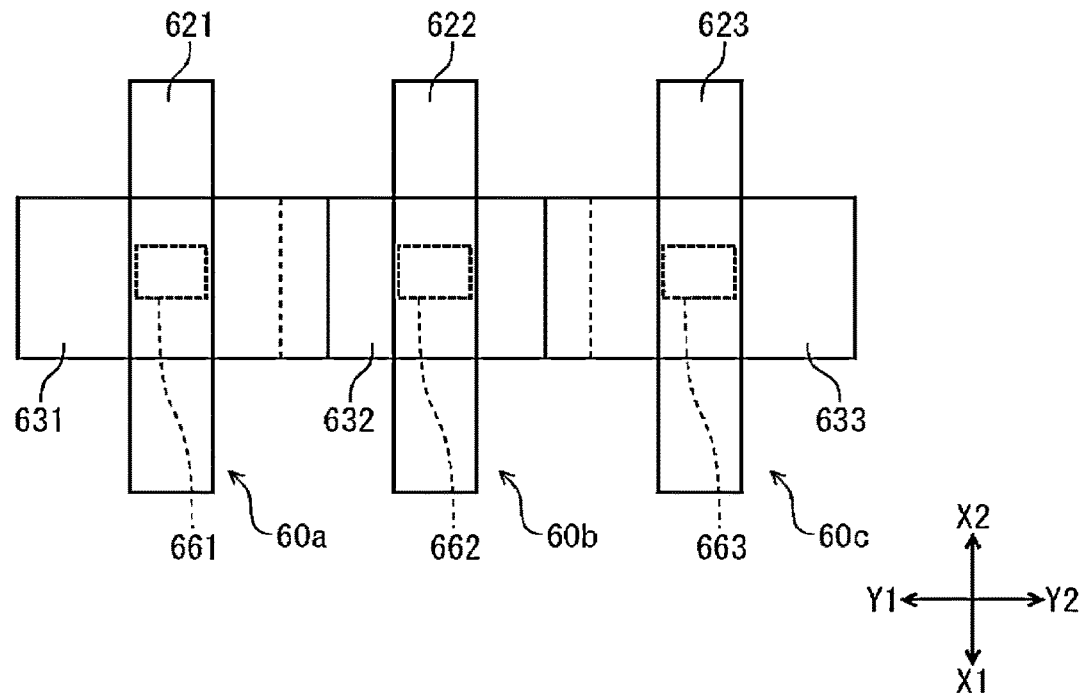
FIG. 6B is a plan view of the configuration of FIG. 6A.

According to the third embodiment, as illustrated in FIGS. 6A and 6B, unlike the first embodiment, three pairs of bus bars (upper shields 631, 632, and 633 and lower shields 641, 642, and 643, respectively) of three adjacent current detection units are arranged so as to be staggered in the up-down direction and are disposed at the same position in the front-rear direction. Other configurations are the same as those in the first embodiment, and detailed description of a member that is the same as in the first embodiment is omitted.

As illustrated in FIG. 6B, like the first and second embodiments, three bus bars 621, 622, and 623 are aligned in the left-right (the Y1-Y2 direction), and each of the bus bars 621, 622, and 623 is extended in the front-rear direction. Three magnetic sensors 661, 662, and 663 are disposed above the three bus bars 621, 622, and 623 so as to face the bus bars 621, 622, and 623, respectively.

Furthermore, as illustrated in FIG. 6A, the first upper shield 631 and the first lower shield 641 are arranged so as to face each other from above and below and sandwich, from above and below, the first bus bar 621 and the first magnetic sensor 661 that face each other. These members constitute a first current detection unit 60a. Similarly, the second upper shield 632 and the second lower shield 642 are arranged so as to face each other from above and below and sandwich, from above and below, the second bus bar 622 and the second magnetic sensor 662 that face each other. These members constitute a second current detection unit 60b. Furthermore, the third upper shield 633 and the third lower shield 643 are arranged so as to face each other from above and below and sandwich, from above and below, the third bus bar 623 and the third magnetic sensor 663 that face each other. These members constitute a third current detection unit 60c.

As illustrated in FIG. 6A, in the up-down direction, the second current detection unit 60b is disposed below the first current detection unit 60a and the third current detection unit 60c that are disposed at the same position. Furthermore, as illustrated in FIGS. 6A and 6B, the left and right end portions of the second upper shield 632 and the second lower shield 642 of the second current detection unit 60b enter the first current detection unit 60a or the third current detection unit 60c such that the left and right end portions do not come into contact with the magnetic sensor and bus bar in the first current detection unit 60a or the third current detection unit 60c.

According to the configuration described above, the three bus bars can be aligned in the left-right direction without shifting the bus bars in the front-rear direction, thus preventing an increase in the size in the bus bar extension direction (the X1-X2 direction). In addition, since adjacent shields in the left-right direction are overlapped, an increase in the size in the left-right direction can be prevented. While the present invention has been described with reference to the above embodiments, the present invention is not limited to the above embodiments. Various improvements and changes can be made within the purpose of improvement or within the spirit and scope of the present invention.

As described above, the current detection device according to the present invention is useful in that it can reduce the size of the configuration as viewed in the direction in which the bus bar and the magnetic sensor face each other while reducing the influence of the magnetic field generated by a current to be measured flowing through an adjacent bus bar.

What is claimed is:
1. A current detection device comprising:
a plurality of current detection units arranged in the current detection device, each of the current detection units including:
a bus bar extending in a first direction, configured to allow a current to be measured to flow therethrough;
a magnetic sensor facing the bus bar in a second direction; and
a pair of shields disposed at a position corresponding to the magnetic sensor and facing each other in the second direction, such that the bus bar and the magnetic sensor are interposed between the pair of shields,
wherein the plurality of current detection units are arranged in a third direction such that the bus bars of the plurality of current detection units are aligned to one another, and
wherein as viewed from the second direction, the position of the shield along the first direction in one of the plurality of current detection units is different from the position of the shield along the first direction in an adjacent current detection unit adjacent to the one current detection unit,
wherein, as viewed from the first direction, the pair of shields in the one current detection unit and that in the adjacent current detection unit partially overlap each other in the third direction,
and wherein, as viewed from the second direction, the pair of shields in each current detection unit has at least one cutout in an outer edge thereof, such that the cutout of the pair of shields in the one current detection unit fits another cutout of the pair of shields in the adjacent current detection unit in a plan view from the second direction, in a portion where the pair of shields partially overlap each other in the third direction.
2. The current detection device according to claim 1, wherein the position of the pair of shields along the second direction in the one current detection unit is the same as that in the adjacent current detection unit, and a position of the magnetic sensor along the second direction in the one current detection unit is the same as that in the adjacent current detection unit.

* * * * *